United States Patent [19]

Kim

[11] Patent Number: 4,783,847
[45] Date of Patent: Nov. 8, 1988

[54] ELECTRONIC TUNING DEVICE

[75] Inventor: Moon-Sup Kim, Kyungki-do, Rep. of Korea

[73] Assignee: Sinbang Electronics Co., Ltd., Chungchun-Dong, Rep. of Korea

[21] Appl. No.: 913,010

[22] Filed: Sep. 26, 1986

[51] Int. Cl.⁴ .............................................. N04B 1/06
[52] U.S. Cl. ........................................ 455/158; 455/185; 455/186
[58] Field of Search ................. 455/158, 183, 185, 186

[56] References Cited

U.S. PATENT DOCUMENTS 4,314,375 2/1982 Belisomi .............................. 455/158
4,392,246 7/1983 Niioka et al. ....................... 455/158

FOREIGN PATENT DOCUMENTS

| 3712 | 1/1978 | Japan | 455/158 |
| 149542 | 11/1980 | Japan | 455/158 |
| 58-412 | 4/1982 | Japan | 455/158 |
| 70619 | 4/1983 | Japan | 455/158 |
| 230330 | 12/1984 | Japan | 455/158 |

Primary Examiner—Michael A. Masinick
Attorney, Agent, or Firm—Ladas & Parry

[57] ABSTRACT

An electronic tuning device displays broadcasting station name letters and frequency numbers which are memorized in advance by pressing a preset button and a memory entry button thereon.

2 Claims, 1 Drawing Sheet

ELECTRONIC TUNING DEVICE

BACKGROUND OF THE INVENTION

The present invention relates to an electronic tuning device for a receiver that displays broadcasting station names in alphabet letters and their broadcasting frequencies in Arabic numbers on a liquid crystal display unit.

In the prior art, conventional radio receiving sets have employed, for tuning in dependence upon listener's memories, analog tuning devices that select a desired frequency of broadcasting for listening by setting tuner dials or cursors to one of the frequencies indicated on graduators or electronic tuning devices that select a frequency from those displayed in Arabic numbers on liquid crystal, LED, or FL display units.

These tuning devices are inconvenient, however, because a listener who does not have a good memory of the desired frequency has the difficulty of trying to remember the frequency of searching for the frequency, thus taking much time.

The conventional electronic tuning device is also inconvenient in that a listener in an area where a number of broadcasting stations are concentrated is hardly likely to have memorized all the frequencies of the stations displayed in Arabic numbers for selection and, thus, is likely to have difficulty selecting the one desired.

SUMMARY OF THE INVENTION

The object of the present invention is to avoid such inconveniences of such conventional tuning devices.

According to the invention, an electronic tuning device displays broadcasting station names in letters and their designated frequencies in Arabic numbers on a liquid crystal display unit to enable a listener to find the desired station easily by name and frequency and to enhance the serviceability and reliability of the tuning device.

DESCRIPTION OF AN EMBODIMENT

Figure 1:
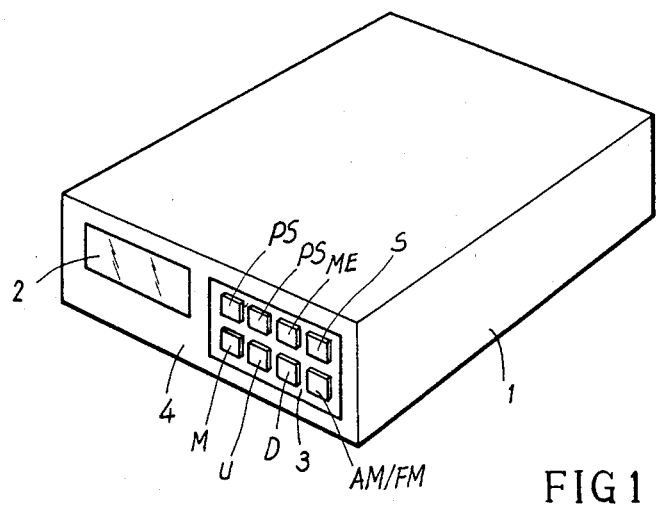
FIG. 1 shows a perspective view of an electronic tuning device of the present invention.
Figure 2:
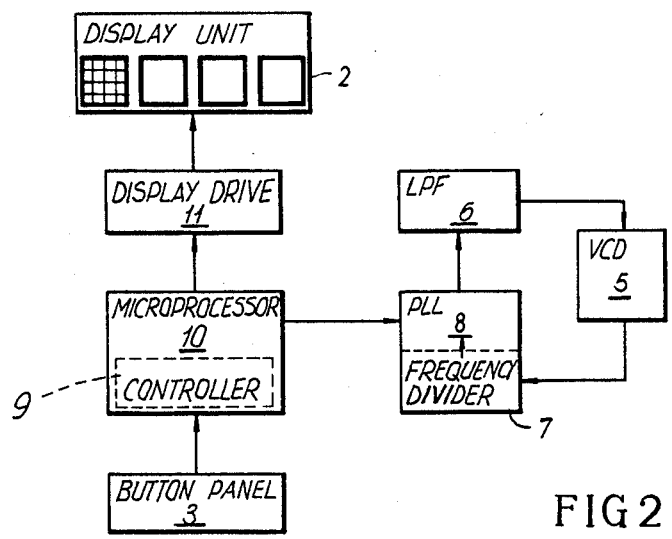
FIG. 2 shows a block diagram of the device in FIG. 1.

The construction of a device of the invention shall now be described in reference to drawings in FIGS. 1 and 2.

A controller 9 that controls the electronic tuning device is placed within a microprocessor 10 and memorizes broadcasting station names and frequencies in a memory and selects a frequency as required. A selecting button panel 3 and a liquid crystal display unit 2 of 5×7 dot matrix type consisting of four digits are mounted on the front panel 4 of the receiver main body 1. The liquid crystal disply unit 2 is connected to a display drive member 11 so as to display the station names and proper frequencies in memory on the liquid crystal display unit in accordance with selection and pressing of a Preset button PS on the button panel.

According to the invention, the controller 9 within the microprocessor 10 is connected with a phase locked loop (hereinafter PLL) 8. A frequency divider 7 is connected to the PLL and a voltage controlled oscillator (hereinafter VCO) 5 is, in turn, connected to the frequency divider. A low-pass filter (hereinafter LPF) 6 is connected to the VCO 5 and the PLL 8 is connected to the LPF. The display drive 11 is connected to the liquid crystal display unit 2 of 5×7 dot matrix type and four digits. The microprocessor 10, with its controller 9, is connected to the liquid crystal display drive 11. The selecting button panel 3 is connected to the microprocessor in order to complete an electronic tuning device.

The electronic tuning device of the foregoing description has a single chip comprising the frequency divider 7 and PLL 8 and another single chip comprising the microprocessor 10 and its controller 9, said microprocessor 10 employing a single chip of 4 Bits so as to make it easy to alter the operation program of the tuning device.

In order to display station names and their proper frequencies in letters and numbers, the liquid crystal display unit 2 fundamentally possesses four digits of 5×7 dot matrix.

Employing these four digits, consequently, the broadcasting frequencies of all regions other than the European region may be displayed with the names of the stations (Examples: KBS 1, MBC, AFKN, etc.). If five digits were employed, Europe also could be included. (The codes of the stations in the United States are limited to 4 alphabet letters starting with K or W, and Korea and Japan are also limited to 4 alphabet letters).

Operation and characteristics of the invention shall now be described in detail with reference to the drawings.

Upon pressing a Seek button S on the button panel 3, a seek signal is impressed on the microprocessor 10 and controller 9, which automatically start seeking the frequency memorized for the button and stop operation on detecting the frequency displayed on the liquid crystal display unit 2. The seek operation stops if any of a memory entry (hereinafter ME), Seek S, Preset PS and Memory M buttons are pressed during the operation.

Upon pressing one of Up U or Down D buttons of the panel 3, a corresponding manual up/down signal is impressed in the microprocessor 10 for the controller 9 to increase of decrease the frequency that is displayed on the liquid crystal display step by step for each signal of the up/down button. Upon being given continued signals from the Up/Down buttons for more than any given time, the controller 9 continually increases or decreases the frequency at a given speed. Besides, in the state of displaying alphabet letters or Arabic numbers on the display 2, the Up/Down buttons cycle the alphabet letters and Arabic numbers.

Upon pressing the ME button of the panel 3, with the display 2 in the state of displaying a station name or frequency, the display also displays the letters "ME" for a given time during which, if a Preset button PS were pressed, a code number of the Preset button is displayed on the display unit, while the frequency previously on display is stored in the corresponding preset memory in the microprocessor 10. (Also, the liquid crystel display unit 2, upon each pressing of the ME button during the displaying of letters and numbers, moves these by a space of its four digits and blinks one so that letters and numbers can be placed on stand-by for memory).

Six preset buttons PS (only two shown) on the panel 3 are, after such memory entry or input, call or preset memories, and make conversions between station names and frequencies displayed on display 2 upon each press of the button. A press of a preset memory button PS having such a preset memory of a broadcasting station first calls the station name to be displayed on the unit 2 and another press of the same button calls the station's frequency for a next display.

In the case of pressing a preset memory button PS not having such a preset memory of a broadcasting station, a frequency is displayed, and another press of the button brings blinking of the first digit to show a stand-by for memory input. One more press brings a frequency display again.

By means of a preset memory button, therefore, the names of six FM broadcasting stations and their broadcasting frequencies and six AM broadcasting stations and their broadcasting frequencies may be memorized, via an alternating AM/FM switch button AM/FM of known type.

Operation of the electronic tuning unit shall now be described with an example.

Suppose, for the example, that a KBS 2 station name having a 89.1 MHZ frequency of broadcasting is to be memorized.

Pressing a Preset button PS causes a broadcast frequency to appear on the display unit 2. Then pressing one of the Up/Down buttons U, D of the selection button panel 3 impresses an Up/Down signal of the controller 9, and as such press actuation continues, the number of the frequency on display in the liquid crystal display unit 2 increases or decreases step by step to reach the desired number of the frequency, that is, 89.1 MHZ. Releasing the Up/Down button then keeps 89.1 MHZ on the display unit 2.

Pressing the seek button S on the selection button panel 3 then produces the seek signal of the desired frequency, that is, 89.1 MHZ, and the display on the panel 2 keeps the 89.1 MHZ frequency, too. Then a press of the ME button of the panel 3 brings blinks of "ME" letters on the display unit 2 for 5 seconds and another press of the same Preset button results in memorization of 89.1 MHZ in the preset memory within the microprocessor 10. One more press of the same Preset button brings blinks of a first digit on the display unit and then another press of Up/Down button on the panel 3 makes a cyclic display of letters and numbers according to the program of the microprocessor 10. When the sought letter, "K," then comes to be displayed, the Up/Down button is released to keep the letter "K" in blinking and then a press of the ME button of the button panel 3 memorizes this letter as the first one, and the next digit begins to blink. Operations of memorization for the second, third and fourth letters proceeds for the sought letters "B" and "S" and number "2" in the same manner as for the foregoing procedure.

Consequently, the liquid crystal display unit 2 comes to display "KBS 2" and it remains possible to display 89.1 MHZ, too, which is thereby in association with the foregoing letters, thus having an effect of memorizing the name and frequency of a desired broadcasting station for playback.

According to the invention, the user of the electronic tuning device may require a guide for the names and frequencies of broadcasting stations in the broadcasting service area in order to have them memorized by the Preset buttons.

The electronic tuning unit has to be programmed in the controller 9 and microprocessor 10 with respective softwares suitable to the tuning unit. Besides, the display unit 2 has to be a unit capable of displaying alphabet letters and Arabic numbers, such as one consisting of 4 to 5 digit 5×7 dot matrix LCD, FL or LED unit. The limit of input memories of broadcasting station names and their corresponding broadcasting frequencies is determined by the memory capacity of the microcomputer chip.

I claim:

1. In an electronic tuning device for a broadcast receiver, the electronic tuning device displaying broadcasting station name letters and frequency numbers, the improvement comprising:

memorizing means responsive to pressing at least one button on an electronic tuning device for seeking and memorizing sought name letters and frequency numbers of at least one broadcast station; and seeking means responsive to pressing at least one other button on the electronic tuning device for displaying the memorized name letters and frequency numbers and for producing a tuning signal corresponding the name letters and frequency numbers, whereby a broadcast receiver may be tuned to receive the signal of the broadcast station.

2. In an electronic tuning device for a broadcast receiver, the electronic tuning device displaying broadcasting station name letters and frequency numbers, the improvement comprising:

a display unit for displaying broadcasting station name letters and frequency numbers;

presetting means comprising a Preset button for causing the number of a broadcast frequency to appear on the display unit when the Preset button is pressed;

up/down means comprising Up and Down buttons respectively for causing the numbers of the broadcast frequency on the display unit to increase and decrease step by step when pressed, whereby a sought frequency may be displayed on the display unit;

memory-entry means comprising an ME button for memorizing the broadcast frequency numbers on the display unit upon another press of the Preset button after the ME button has been pressed;

cycling means responsive to successive further pressings of the Preset button for putting the numbers of the broadcast frequency on the display unit successively into a blinking state, responsive to another pressing of one of the Up and Down buttons for cycling the number then in the blinking state respectively up and down through an alphabet of letters to a sought letter, and responsive to another pressing of the ME button for then memorizing the sought letter, whereby each letter sought for the broadcasting station name may be successively memorized; and seeking means responsive to two further pressings of the Preset button for first displaying one of the memorized broadcast frequency numbers and the letters of the station name and then displaying the other, the seeking means also producing a seek signal corresponding to the memorized broadcast frequency numbers, whereby an electronic tuning device for a broadcast receiver can be tuned to that frequency.

* * * * *